United States Patent
Cheng

(10) Patent No.: US 10,673,421 B1
(45) Date of Patent: Jun. 2, 2020

(54) LEVEL SHIFTER DEVICE AND OPERATION METHOD THEREOF

(71) Applicant: Novatek Microelectronics Corp., Hsinchu (TW)

(72) Inventor: Yen-Cheng Cheng, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/658,176

(22) Filed: Oct. 21, 2019

(51) Int. Cl.
*H03K 3/356* (2006.01)
*H03K 3/037* (2006.01)
*H03K 19/0185* (2006.01)

(52) U.S. Cl.
CPC ..... *H03K 3/356034* (2013.01); *H03K 3/0375* (2013.01); *H03K 19/018514* (2013.01)

(58) Field of Classification Search
CPC ........... H03K 3/356034; H03K 3/0375; H03K 19/018514
See application file for complete search history.

(56) References Cited

U.S. PATENT DOCUMENTS

| 7,212,060 B1* | 5/2007 | Zhou | G01R 31/3004 326/16 |
| 7,560,936 B1* | 7/2009 | Hronik | G01R 19/16552 324/537 |
| 2019/0074830 A1* | 3/2019 | Mirabella | H03K 17/284 |

* cited by examiner

*Primary Examiner* — Daniel D Chang
(74) *Attorney, Agent, or Firm* — JCIPRNET

(57) ABSTRACT

A level shifter device and an operation method thereof are provided. The level shifter device includes a buffer, a first level shifter and a dynamic voltage regulation circuit. The buffer includes an output terminal. The first level shifter has a first input terminal coupled to the output terminal of the buffer. The first level shifter has a reference voltage terminal coupled to an analog reference voltage. The dynamic voltage regulation circuit generates a dynamic voltage having a level varied according to a bounce of the analog reference voltage, and provides the dynamic voltage to at least one of the buffer as a power supply and the first level shifter as a bias voltage.

16 Claims, 10 Drawing Sheets

LEVEL SHIFTER DEVICE AND OPERATION METHOD THEREOF

BACKGROUND

Field of the Invention

The invention relates to an electronic circuit and more particularly, to a level shifter device and an operation method thereof.

Description of Related Art

An electronic circuit usually includes a digital circuit and an analog circuit. In general, a digital power supply voltage VCC and a digital ground voltage GND are used to provide power to the digital circuit, and an analog power supply voltage VDDA and an analog reference voltage GNDA are used to provide power to the analog circuit. A voltage range of the digital circuit is usually different from a voltage range of the analog circuit, and thus, a level shifter is disposed between the digital circuit and the analog circuit. The level shifter may convert a swing of a signal of the digital circuit from one of the digital power supply voltage VCC into the analog power supply voltage VDDA, so as to control the analog circuit.

However, during an actual operational process, there is usually a phenomenon of ground bounce in the analog reference voltage GNDA. Namely, the analog reference voltage GNDA usually has ground noise. Generally, the analog power supply voltage VDDA and the analog reference voltage GNDA are used to provide power to the level shifter, and thus, the ground bounce may probably influence the operation of the level shifter. When the analog reference voltage GNDA has a large ground bounce, the ground bounce may result in a small swing of an input signal of the level shifter (i.e., a voltage difference between a level (e.g., VCC) of the input signal and that of the reference voltage GNDA), which causes function failure to the level shifter. Such situation becomes worse as the digital power supply voltage VCC is smaller.

It should be noted that the contents of the section of "Description of Related Art" is used for facilitating the understanding of the invention. A part of the contents (or all of the contents) disclosed in the section of "Description of Related Art" may not pertain to the conventional technology known to the persons with ordinary skilled in the art. The contents disclosed in the section of "Description of Related Art" do not represent that the contents have been known to the persons with ordinary skilled in the art prior to the filing of this invention application.

SUMMARY

The invention provides a level shifter device and an operation method thereof to mitigate the influence caused to the level shifter device by the bounce of the analog reference voltage.

According to an embodiment of the invention, a level shifter device is provided. The level shifter device includes a buffer, a first level shifter and a dynamic voltage regulation circuit. The buffer includes an output terminal. The first level shifter has a first input terminal coupled to an output terminal of the buffer and has a reference voltage terminal coupled to an analog reference voltage. The dynamic voltage regulation circuit is configured to generate a dynamic voltage having a level varied according to a bounce of the analog reference voltage. The dynamic voltage regulation circuit provides the dynamic voltage to at least one of the buffer as a power supply and the first level shifter as a bias voltage.

According to an embodiment of the invention, a level shifter device is provided. The level shifter device includes a level shifter and a dynamic voltage detection circuit. The level shifter has at least one coupling terminal and a reference voltage terminal coupled to an analog reference voltage. The dynamic voltage regulation circuit is configured to generate a dynamic voltage having a level capable of reflecting a bounce of the analog reference voltage and provide the dynamic voltage to the at least one coupling terminal to increase a resistance of the level shifter to the bounce of the analog reference voltage.

According to an embodiment of the invention, an operation method of a level shifter device is provided. The operation method includes: providing a buffer and a first level shifter, wherein a first input terminal of the first level shifter is coupled to an output terminal of the buffer, and a reference voltage terminal of the first level shifter is coupled to an analog reference voltage; generating, by a dynamic voltage regulation circuit, a dynamic voltage having a level varied according to a bounce of the analog reference voltage; and providing, by the dynamic voltage regulation circuit, the dynamic voltage to at least one of the buffer as a power supply and the first level shifter as a bias voltage.

To sum up, the level shifter device and the operation method thereof provided by the embodiments of the invention can generate the dynamic voltage having the level capable of reflecting the bounce of the analog reference voltage. The dynamic voltage can be provided to the level shifter and/or the buffer to mitigate the influence caused to the level shifter by the bounce of the analog reference voltage.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
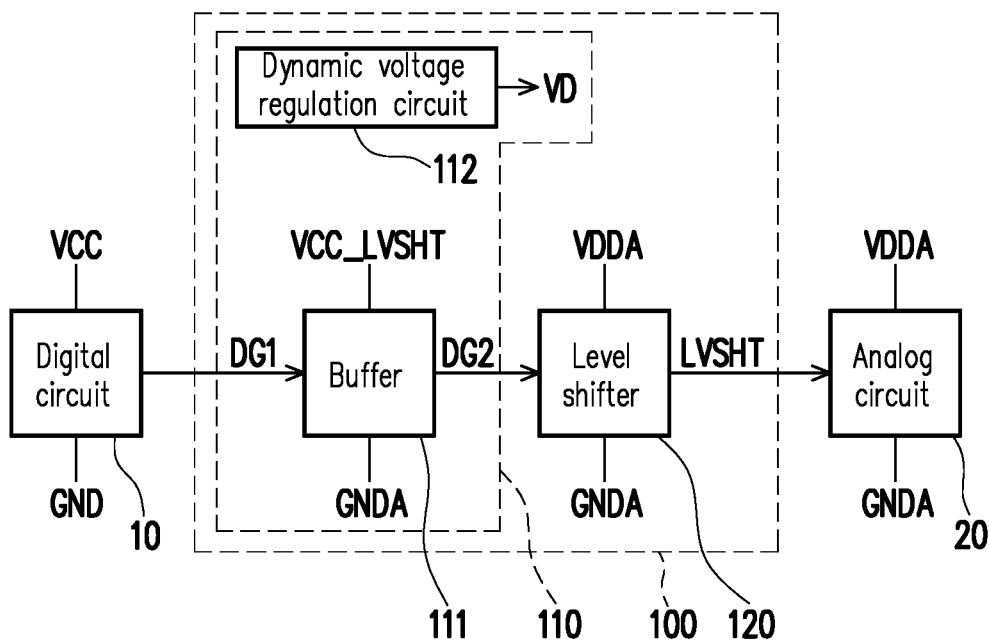
FIG. 1 is a schematic circuit block diagram illustrating a level shifter device according to an embodiment of the invention.

The term "couple (or connect)" throughout the specification (including the claims) of this application are used broadly and encompass direct and indirect connection or coupling means. For example, if the disclosure describes a first apparatus being coupled (or connected) to a second apparatus, then it should be interpreted that the first apparatus can be directly connected to the second apparatus, or the first apparatus can be indirectly connected to the second apparatus through other devices or by a certain coupling means. In addition, terms such as "first" and "second" mentioned throughout the specification (including the claims) of this application are only for naming the names of the elements or distinguishing different embodiments or scopes and are not intended to limit the upper limit or the lower limit of the number of the elements not intended to limit sequences of the elements. Moreover, elements/components/steps with same reference numerals represent same or similar parts in the drawings and embodiments. Elements/components/notations with the same reference numerals in different embodiments may be referenced to the related description.

FIG. 1 is a schematic circuit block diagram illustrating a level shifter device 100 according to an embodiment of the invention. The level shifter device 100 illustrated in FIG. 1 may be disposed between a front stage circuit (e.g., a digital circuit 10) and a rear stage circuit (e.g., an analog circuit 20). A digital power supply voltage VCC and a digital ground voltage GND are used to provide power to the digital circuit 10, and an analog power supply voltage VDDA and an analog reference voltage GNDA are used to provide power to the analog circuit 20.

The level shifter device 100 illustrated in FIG. 1 includes a dynamic voltage detection circuit 110 and a level shifter 120. An input terminal and an output terminal of the level shifter 120 are respectively coupled to an output terminal of the dynamic voltage detection circuit 110 and an input terminal of the rear stage circuit (e.g., the analog circuit 20). A power terminal and a reference voltage terminal of the level shifter 120 are respectively coupled to the analog power supply voltage VDDA and the analog reference voltage GNDA. The dynamic voltage regulation circuit 110 may detect the analog reference voltage GNDA and generate a dynamic voltage VD, wherein a level of the dynamic voltage VD is capable of reflecting a bounce of the analog reference voltage GNDA. In some embodiments, the dynamic voltage detection circuit 110 may provide the dynamic voltage VD to a coupling terminal (e.g., a bias voltage terminal which is not illustrated in FIG. 1 and will be described below) of the level shifter 120 to increase a resistance of the level shifter 120 to the bounce of the analog reference voltage GNDA.

The dynamic voltage detection circuit 110 illustrated in FIG. 1 includes a buffer 111 and a dynamic voltage regulation circuit 112. An input terminal and an output terminal of the buffer 111 are respectively coupled to an output terminal of the front stage circuit (e.g., the digit circuit 10) and the input terminal of the level shifter 120. A power terminal and a reference voltage terminal of the buffer 111 are respectively coupled to a power supply voltage VCC_LVSHT and the analog reference voltage GNDA. In some embodiments, the dynamic voltage VD provided by the dynamic voltage detection circuit 110 may be served as the power supply voltage VCC_LVSHT and provided to the power terminal of the buffer 111. Accordingly, a voltage across the level shifter 120 can be maintained, allowing the level shifter 120 to have a stronger resistance to the bouncing of the analog reference voltage GNDA. In the same or alternative embodiments, the dynamic voltage regulation circuit 112 may provide the dynamic voltage VD to the level shifter 120 as a bias voltage. The bias voltage capable of being varied with the bouncing of the analog reference voltage GNDA can also result in a stronger resistance of the level shifter 120 to the bouncing of the analog reference voltage GNDA.

Figure 2:
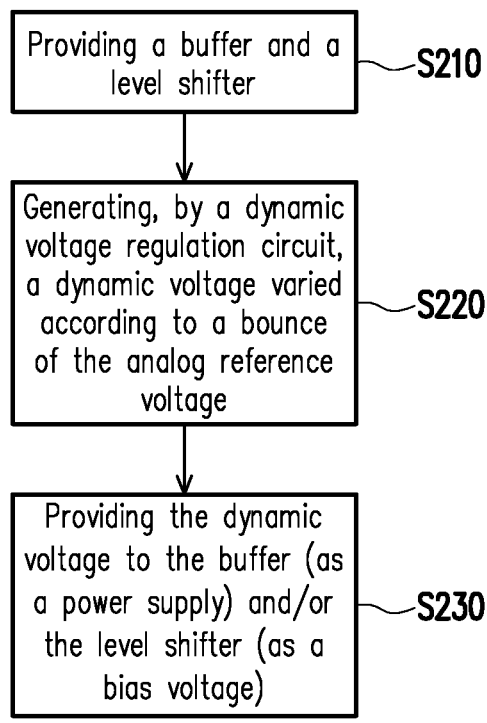
FIG. 2 is a flowchart illustrating an operation method of a level shifter device according to an embodiment of the invention.

FIG. 2 is a flowchart illustrating an operation method of a level shifter device according to an embodiment of the invention. Referring to FIG. 1 and FIG. 2, in step S210, the buffer 111 and the level shifter 120 are provided, wherein the input terminal of the level shifter 120 is coupled to the output terminal of the buffer 111, and the reference voltage terminal of the level shifter 120 is coupled to the analog reference voltage GNDA. In step S220, the dynamic voltage regulation circuit 120 generates the dynamic voltage VD, wherein the level of the dynamic voltage VD is capable of varying according to the bounce of the analog reference voltage GNDA. In step S230, the dynamic voltage regulation circuit 112 may provide the dynamic voltage VD to the buffer 111 as a power supply (as the power supply voltage VCC_LVSHT) and (or) provide the dynamic voltage VD to the level shifter 120 as a bias voltage (which will be described below). The term "and (or)" means either or both of two stated possible implementations.

Figure 3:
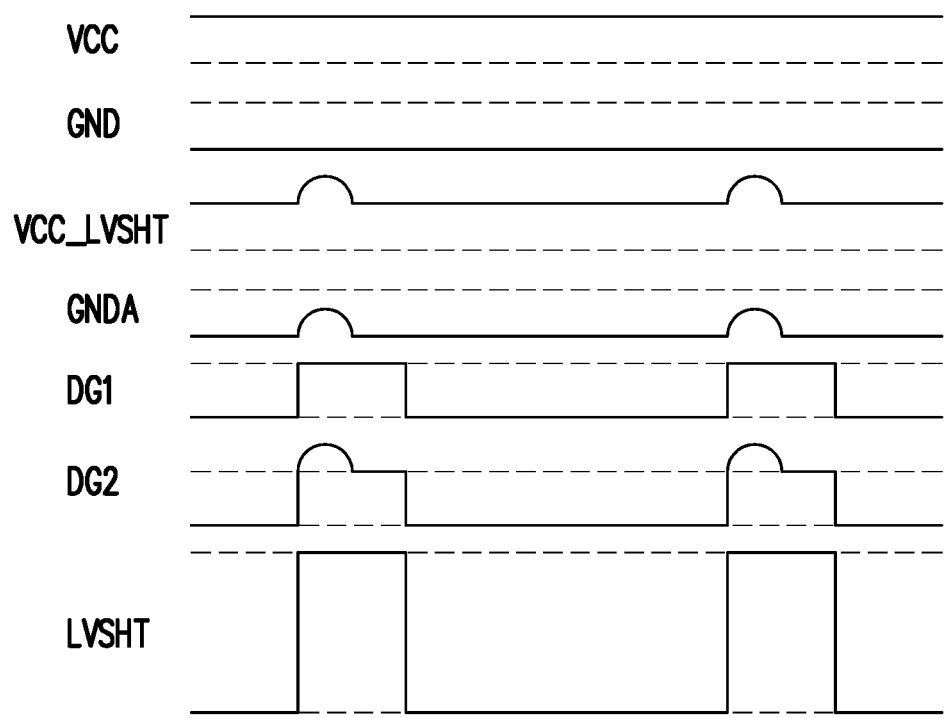
FIG. 3 is a schematic waveform diagram illustrating signals depicted in FIG. 1 according to an embodiment of the invention.

FIG. 3 is a schematic waveform diagram illustrating signals depicted in FIG. 1 according to an embodiment of the invention. In FIG. 3, the horizontal axis represents the time, and the vertical axis represents signal levels (e.g., voltage levels). Referring to FIG. 3, a signal DG1 represents an input signal of the buffer 111, a signal DG2 represents an output signal of the buffer 111, and a signal LVSHT represents an output signal of the level shifter 120. The embodiment illustrated in FIG. 3 is based on the dynamic voltage regulation circuit 112 providing the dynamic voltage VD to the power terminal of the buffer 111 as the power supply voltage VCC_LVSHT. When a phenomenon of "ground bounce" occurs to the analog reference voltage GNDA, i.e., the analog reference voltage GNDA has ground noise, the level of the dynamic voltage VD (i.e., the power supply voltage VCC_LVSHT) is capable of varying according to the bounce of the analog reference voltage GNDA. Based on the power supply voltage VCC_LVSHT, a high logic level of the output signal DG2 of the buffer 111 is also capable of varying according to the bounce of the analog reference voltage GNDA. When the ground bounce occurs to the analog reference voltage GNDA, the ground bounce also synchronously occurs to the output signal DG2 of the buffer 111, and thus, it is sufficient for a voltage difference between a high logic level of an input signal of the level shifter 120 and a voltage level of the reference voltage GNDA to trigger the level shifter 120 to operate normally. Thereby, the bounce of the analog reference voltage GNDA does not influence the function of the level shifter.

Figure 4:
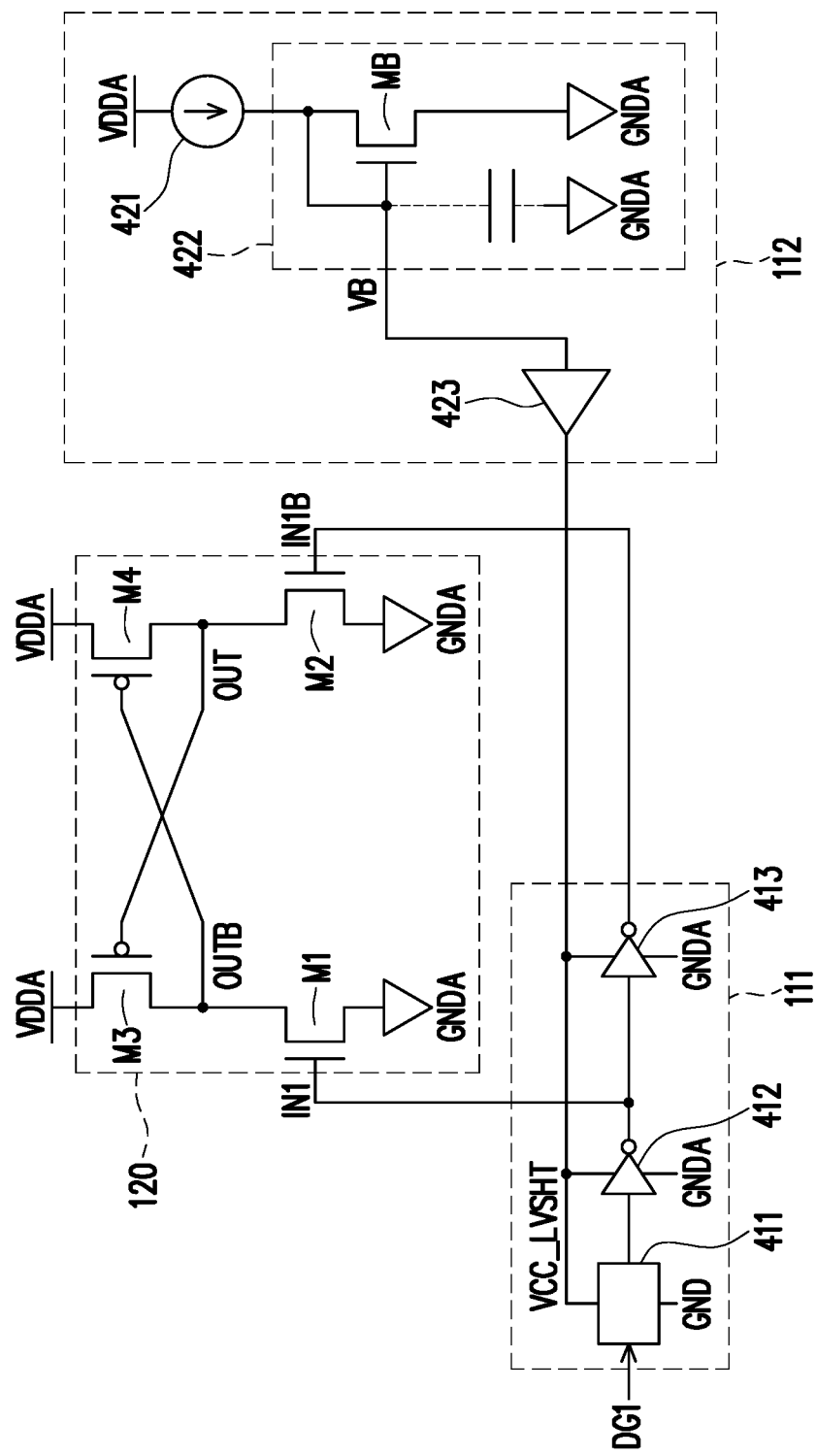
FIG. 4 is a schematic circuit diagram illustrating the level shifter device depicted in FIG. 1 according to an embodiment of the invention.

FIG. 4 is a schematic circuit diagram illustrating the level shifter device 100 depicted in FIG. 1 according to an embodiment of the invention. The embodiment illustrated in FIG. 4 is based on the dynamic voltage regulation circuit 112 providing the dynamic voltage VD to the power terminal of the buffer 111 as the power supply voltage VCC_LVSHT. In the embodiment illustrated in FIG. 4, the buffer 111 includes a level shifter 411 and a plurality of cascaded inverters (for example, including an inverter 412 and an inverter 413). An input terminal of the inverter 411 receives the input signal DG1. A power terminal of the level shifter 411 is coupled to the dynamic voltage regulation circuit 112 to receive the dynamic voltage VD (i.e., the power supply voltage VCC_LVSHT). A reference voltage terminal of the level shifter 411 is coupled to the digital ground voltage GND. An input terminal of the inverter 412 is coupled to an output terminal of the level shifter 411. An output terminal of the inverter 412 is coupled to an input terminal IN1 of the level shifter 120. An input terminal of the inverter 413 is coupled to the output terminal of the inverter 412. An output terminal of the inverter 413 is coupled to an input terminal IN1B of the level shifter 120.

A reference voltage terminal of the inverter 412 and a reference voltage terminal of the inverter 413 are coupled to the analog reference voltage GNDA. A power terminal of the inverter 412 and a power terminal of the inverter 413 are coupled to the dynamic voltage regulation circuit 112 to receive the dynamic voltage VD (i.e., the power supply voltage VCC_LVSHT). In other embodiments, one of the power terminals of the inverters 412 and 413 may be coupled to a fixed power supply voltage (e.g., the analog power supply voltage VDDA, the digital power supply voltage VCC or any other power supply voltage) for substituting for the power supply voltage VCC_LVSHT.

The dynamic voltage regulation circuit 112 may generate the dynamic voltage VD (i.e., the power supply voltage VCC_LVSHT) according to the analog reference voltage GNDA. In the embodiment illustrated in FIG. 4, the dynamic voltage regulation circuit 112 includes a current source 421, a resistance element 422 and an operational amplifier 423. A first terminal of the resistance element 422 is coupled to the current source 421. A second terminal of the resistance element 422 is coupled to the analog reference voltage GNDA. An input terminal of the operational amplifier 423 is coupled to the first terminal of the resistance element 422 to receive a bias voltage VB. An output terminal of the operational amplifier 423 is coupled to the power terminal of the buffer 111 to provide the dynamic voltage VD (i.e., the power supply voltage VCC_LVSHT).

In the embodiment illustrated in FIG. 4, the resistance element 422 includes a transistor MB. A first terminal (e.g., a drain) and a control terminal (e.g., a gate) of the transistor MB are coupled to the current source 421 and an input terminal of the operational amplifier 423. A second terminal (e.g., a source) of the transistor MB is coupled to the analog reference voltage GNDA.

In the embodiment illustrated in FIG. 4, the level shifter 120 includes a differential input pair (for example, including a transistor M1 and a transistor M2), a transistor M3 and a transistor M4. First terminals (e.g., sources) of the transistors M3 and M4 are coupled to the analog power supply voltage VDDA. A second terminal (e.g., a drain) of the transistor M3 is coupled to a control terminal (e.g., a gate) of the transistor M4. A control terminal (e.g., a gate) of the transistor M3 is coupled to a second terminal (e.g., a drain) of the transistor M4. A first terminal (e.g., a drain) of the transistor M1 is coupled to the second terminal of the transistor M3. A second terminal (e.g., a source) of the transistor M1 is coupled to the analog reference voltage GNDA. A control terminal (e.g., a gate) of the transistor M1 is served as the input terminal IN1 of the level shifter 120. A first terminal (e.g., a drain) of the transistor M2 is coupled to the second terminal of the transistor M4. A second terminal (e.g., a source) of the transistor M2 is coupled to the analog reference voltage GNDA. A control terminal (e.g., a gate) of the transistor M2 is served as the input terminal IN1B of the level shifter 120.

Figure 5:
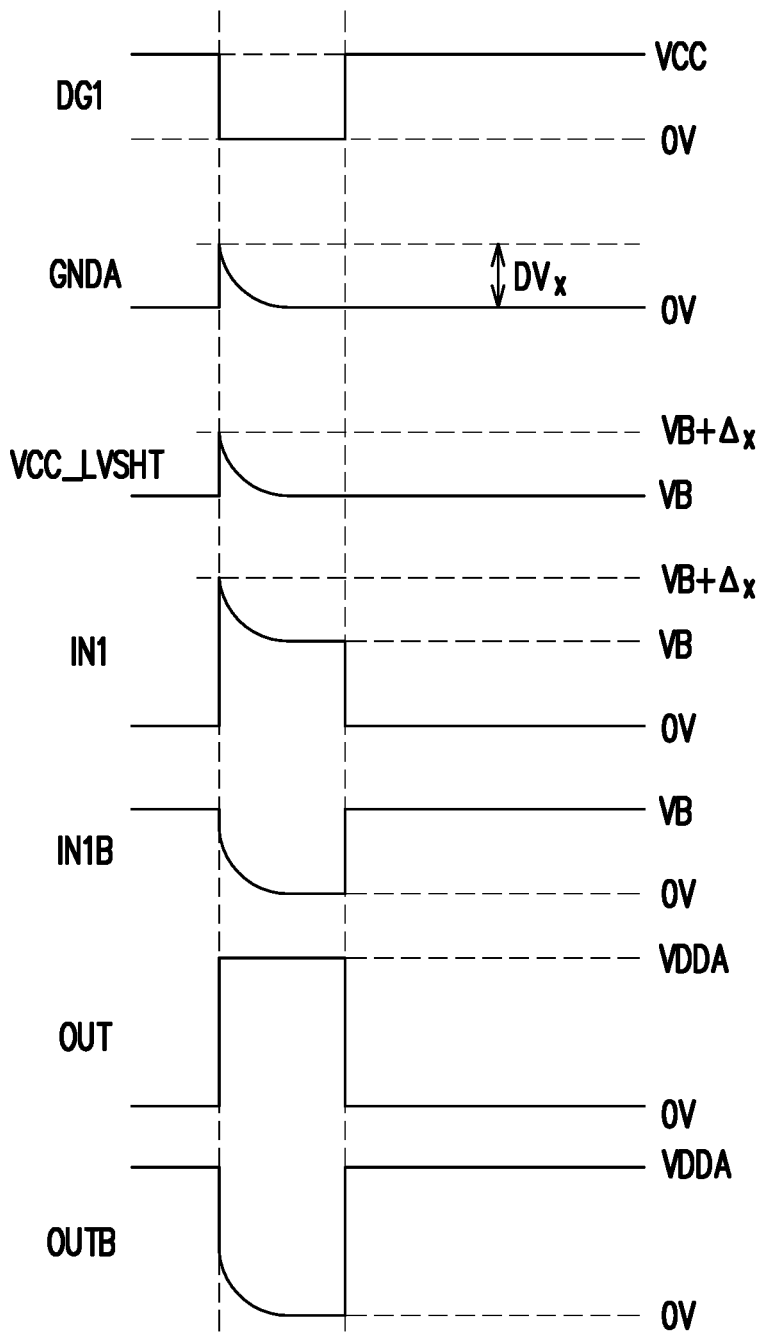
FIG. 5 is a schematic waveform diagram illustrating signals depicted in FIG. 4 according to an embodiment of the invention.

FIG. 5 is a schematic waveform diagram illustrating signals depicted in FIG. 4 according to an embodiment of the invention. Referring to FIG. 5, the horizontal axis represents the time, and the vertical axis represents signal levels (e.g., voltage levels). A differential signal of the input terminals IN1 and IN1B illustrated in FIG. 5 is equivalent to the output signal DG2 of the buffer 111. Signals OUT and OUTB represent differential output signals (i.e., the output signal LVSHT) of the level shifter 120. When the phenomenon of ground bounce occurs to the analog reference voltage GNDA, i.e., the analog reference voltage GNDA has the ground noise, the level of the dynamic voltage VD (i.e., the power supply voltage VCC_LVSHT) is capable of varying according to the bounce of the analog reference voltage GNDA. Based on the power supply voltage VCC_LVSHT, a high logic level of the differential signal of the input terminals IN1 and IN1B (which is the output signal DG2 of the buffer 111) is also capable of varying according to the bounce of the analog reference voltage GNDA. Therefore, when the ground bounce occurs to the analog reference voltage GNDA, it is sufficient for the voltage difference between the high logic level of the input signal of the level shifter 120 and the voltage level of the reference voltage GNDA to trigger the level shifter 120.

Figure 6:
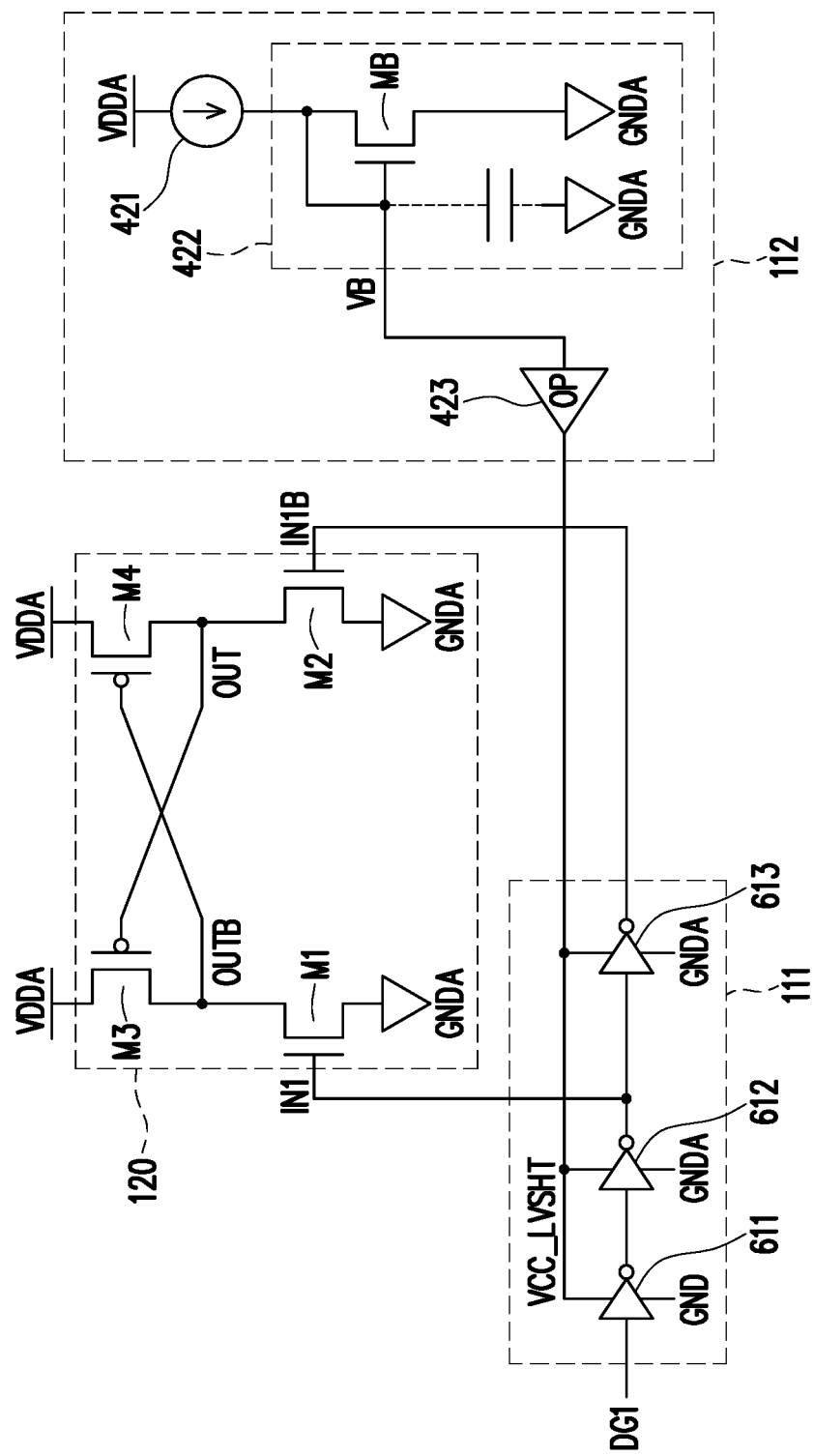
FIG. 6 is a schematic circuit diagram illustrating the level shifter device depicted in FIG. 1 according to another embodiment of the invention.

FIG. 6 is a schematic circuit diagram illustrating the level shifter device 100 depicted in FIG. 1 according to another embodiment of the invention. The embodiment illustrated in FIG. 6 is based on the dynamic voltage regulation circuit 112 providing the dynamic voltage VD to the power terminal of the buffer 111 as the power supply voltage VCC_LVSHT. The level shifter 120 and the dynamic voltage regulation circuit 112 illustrated in FIG. 6 may be inferred with reference to the descriptions related to the level shifter 120 and the dynamic voltage regulation circuit 112 illustrated in FIG. 4 and thus, will not be repeated.

In the embodiment illustrated in FIG. 6, the buffer 111 includes a plurality of cascaded inverters (for example, including an inverter 612, an inverter 612 and an inverter 613). An input terminal of the inverter 611 receives the input signal DG1. An input terminal of the inverter 612 is coupled to an output terminal of the inverter 611. An output terminal of the inverter 612 is coupled to the input terminal IN1 of the level shifter 120. An input terminal of the inverter 613 is coupled to the output terminal of the inverter 612. An output terminal of the inverter 613 is coupled to the input terminal IN1B of the level shifter 120. Power terminals of the inverters 611, 612 and 613 are coupled to the dynamic voltage regulation circuit 112 to receive the dynamic voltage VD (i.e., the power supply voltage VCC_LVSHT). A reference voltage terminal of the inverter 611 is coupled to the digital ground voltage GND. Reference voltage terminals of the inverters 612 and 613 are coupled to the reference voltage terminal GNDA.

Figure 7:
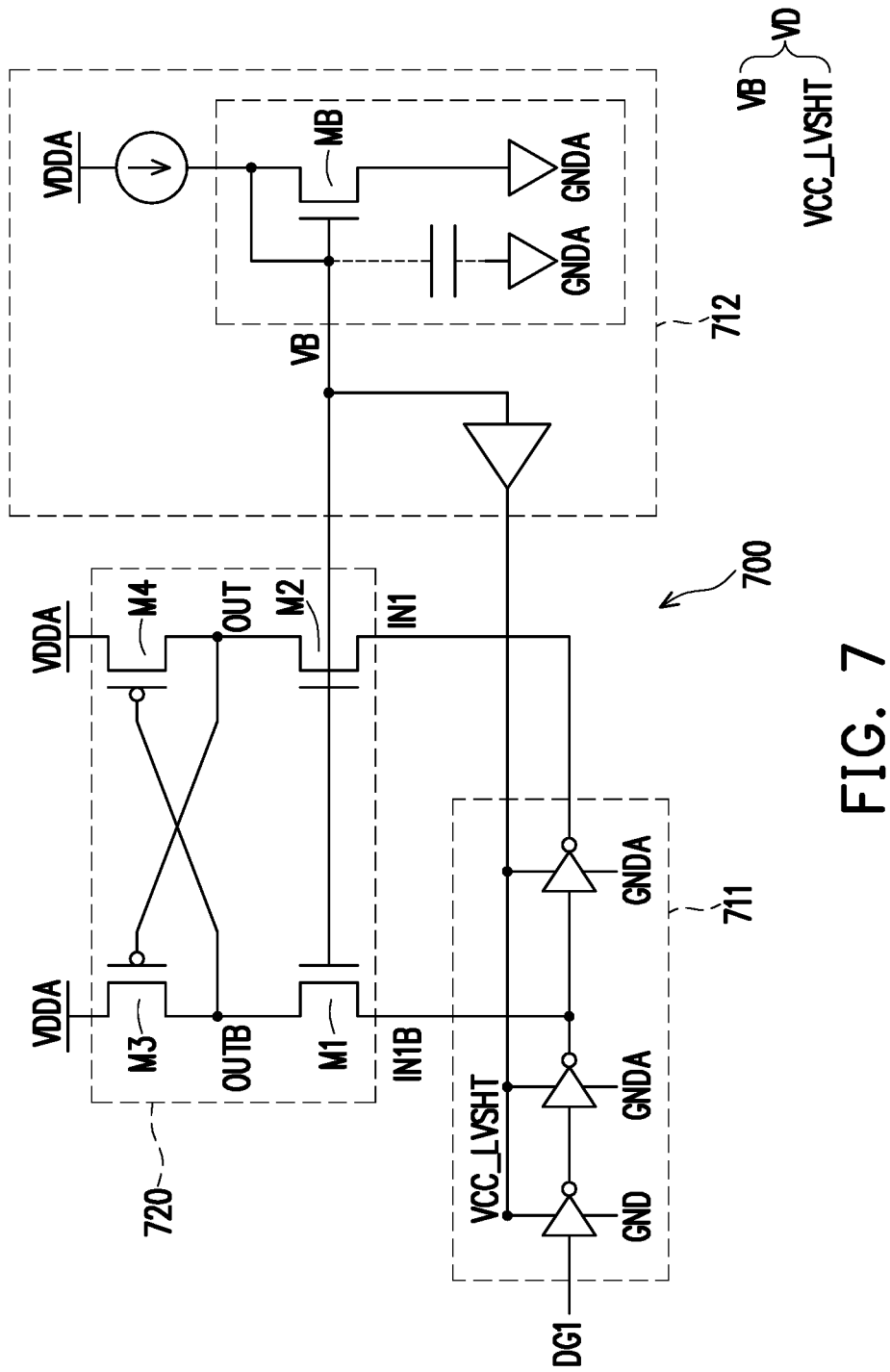
FIG. 7 is a schematic circuit diagram illustrating a level shifter device according to another embodiment of the invention.

FIG. 7 is a schematic circuit diagram illustrating a level shifter device 700 according to another embodiment of the invention. The level shifter device 700 illustrated in FIG. 7 includes a buffer 711, a level shifter 720 and a dynamic voltage regulation circuit 712. The level shifter 720 illustrated in FIG. 7 may be inferred with reference to the description related to the level shifter 120 illustrated in FIG. 1 through FIG. 6. The buffer 711 illustrated in FIG. 7 may be inferred with reference to the description related to the buffer 111 illustrated in FIG. 6, and the dynamic voltage regulation circuit 712 illustrated in FIG. 7 may be inferred with reference to the description related to the dynamic voltage regulation circuit 112 illustrated in FIG. 4, which will not be repeated. In the embodiment illustrated in FIG. 7, the dynamic voltage VD generated by the dynamic voltage regulation circuit 712 includes the bias voltage VB and the power supply voltage VCC_LVSHT. The dynamic voltage regulation circuit 712 provides the power supply voltage VCC_LVSHT (i.e., the dynamic voltage VD) to a power terminal of the buffer 711. The dynamic voltage regulation circuit 712 provides the bias voltage VB (i.e., the dynamic voltage VD) to a coupling terminal (e.g., a bias voltage terminal) of the level shifter 720.

In the embodiment illustrated in FIG. 7, the level shifter 720 includes a differential input pair (for example, including the transistor M1 and the transistor M2), the transistor M3 and the transistor M4. The first terminals (e.g., the sources) of the transistors M3 and M4 are coupled to the analog power supply voltage VDDA. The second terminal (e.g., the drain) of the transistor M3 is coupled to the control terminal (e.g., the gate) of the transistor M4. The control terminal (e.g., the gate) of the transistor M3 is coupled to the second terminal (e.g., the drain) of the transistor M4. The first terminal (e.g., the source) of the transistor M1 is served as the input terminal IN1B of the level shifter 720. The second terminal (e.g., the drain) of the transistor M1 is coupled to the second terminal of the transistor M3. The first terminal (e.g., the source) of the transistor M2 is served as the input terminal IN1 of the level shifter 720. The second terminal (e.g., the drain) of the transistor M2 is coupled to the second terminal of the transistor M4. The control terminal (e.g., the gate) of the transistor M1 and the control terminal (e.g., the gate) of the transistor M2 are served as the bias voltage terminal of the level shifter 720. Namely, the control terminals of the transistors M1 and M2 are coupled to the dynamic voltage regulation circuit 712 to receive the bias voltage VB (i.e., the dynamic voltage VD).

Figure 8:
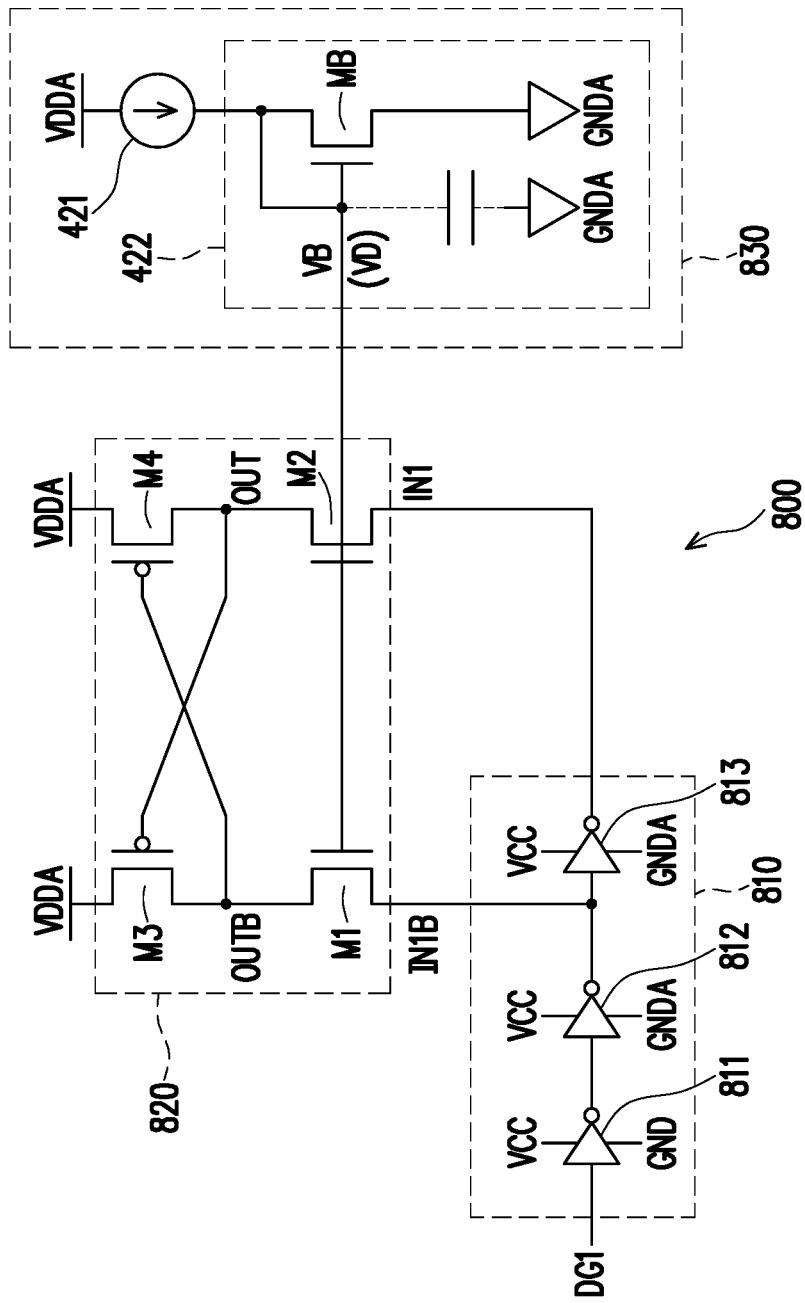
FIG. 8 is a schematic circuit diagram illustrating a level shifter device according to yet another embodiment of the invention.

FIG. 8 is a schematic circuit diagram illustrating a level shifter device 800 according to yet another embodiment of the invention. The level shifter device 800 illustrated in FIG. 8 includes a buffer 810, a level shifter 820 and a dynamic voltage regulation circuit 830. In the embodiment illustrated in FIG. 8, the dynamic voltage regulation circuit 830 includes a current source 421 and a resistance element 422. The current source 421 and the resistance element 422 illustrated in FIG. 8 may be inferred with reference to the descriptions related to the current source 421 and the resistance element 422 illustrated in FIG. 4 and thus, will not be repeated. In the embodiment illustrated in FIG. 8, the dynamic voltage VD generated by the dynamic voltage regulation circuit 830 includes the bias voltage VB. The dynamic voltage regulation circuit 830 provides the bias voltage VB (i.e., the dynamic voltage VD) to a coupling terminal (e.g., a bias voltage terminal) of the level shifter 820. The level shifter 820 illustrated in FIG. 8 may be inferred with reference to the description related to the level shifter 720 illustrated in FIG. 7 and thus, will not be repeated.

The buffer 810 illustrated in FIG. 8 includes a plurality of cascaded inverters (for example, including an inverter 811, an inverter 812 and an inverter 813). An input terminal of the inverter 811 receives the input signal DG1. An input terminal of the inverter 812 is coupled to an output terminal of the inverter 811. An output terminal of the inverter 812 is coupled to the input terminal IN1B of the level shifter 820. An input terminal of the inverter 813 is coupled to the output terminal of the inverter 812. An output terminal of the inverter 813 is coupled to the input terminal IN1 of the level shifter 820. Power terminals of the inverters 811, 812 and 813 are coupled to the digital power supply voltage VCC. A reference voltage terminal of the inverter 811 is coupled to the digital ground voltage GND. Reference voltage terminals of the inverters 812 and 813 are coupled to the reference voltage terminal GNDA.

Figure 9:
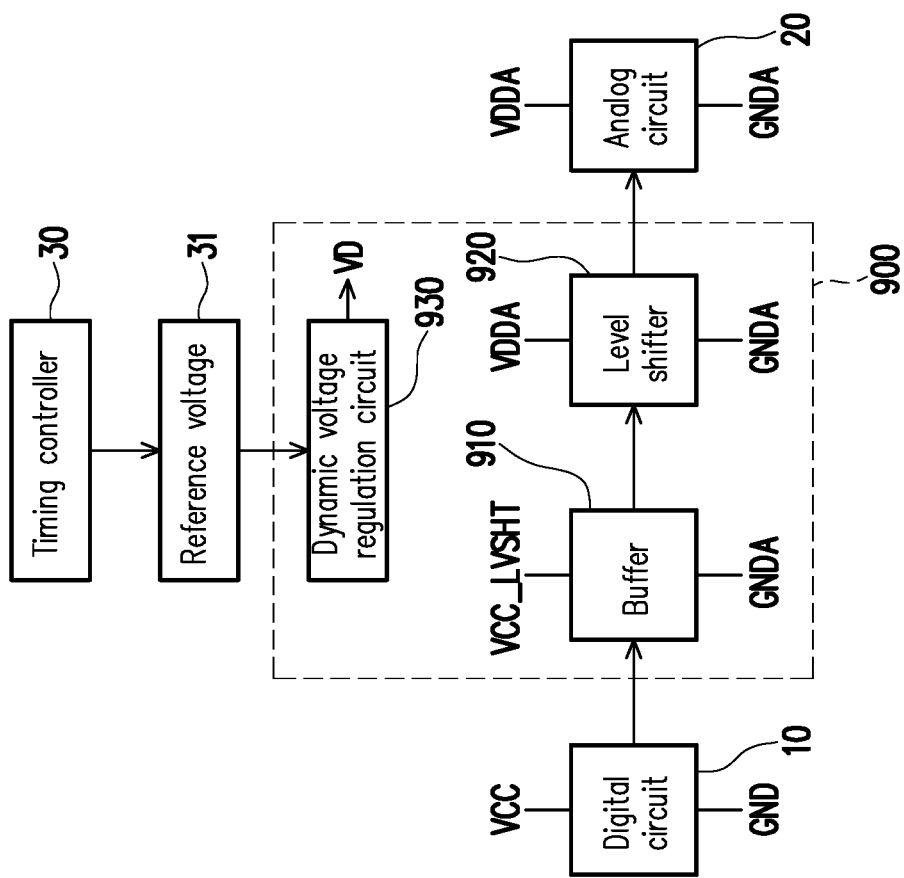
FIG. 9 is a schematic circuit block diagram illustrating a level shifter device according to still another embodiment of the invention.

FIG. 9 is a schematic circuit block diagram illustrating a level shifter device 900 according to still another embodiment of the invention. The level shifter device 900 illustrated in FIG. 9 may be disposed between a front stage circuit (e.g., the digital circuit 10) and a rear stage circuit (e.g., the analog circuit 20). The level shifter device 900 illustrated in FIG. 9 includes a buffer 910, a level shifter 920 and a dynamic voltage regulation circuit 930. An input terminal of the buffer 910 is coupled to an output terminal of the front stage circuit (e.g., the digital circuit 10). A power terminal and a reference voltage terminal of the buffer 910 are respectively coupled to the power supply voltage VCC_LVSHT and the analog reference voltage GNDA. An input terminal and an output terminal of the level shifter 920 are respectively coupled to an output terminal of the buffer 910 and an input terminal of the rear stage circuit (e.g., the analog circuit 20). A power terminal and a reference voltage terminal of the level shifter 920 are respectively coupled to the analog power supply voltage VDDA and the analog reference voltage GNDA.

In the embodiment illustrated in FIG. 9, the dynamic voltage regulation circuit 930 may receive a reference voltage 31 from a timing controller 30. The dynamic voltage regulation circuit 930 may generate the dynamic voltage VD according to the reference voltage 31, wherein the level of the dynamic voltage VD is capable of reflecting the bounce of the analog reference voltage GNDA. In some embodiments, the dynamic voltage VD provided by the dynamic voltage regulation circuit 930 may be served as the power supply voltage VCC_LVSHT and provided to the power terminal of the buffer 111. In some other embodiments, the dynamic voltage VD may be provided to the level shifter 920 as a bias voltage. The buffer 910 and the level shifter 920 illustrated in FIG. 9 may be inferred with reference to the descriptions related to the buffer 111 and the level shifter 120 illustrated in FIG. 1 through FIG. 6, may be inferred with reference to the descriptions related to the buffer 711 and the level shifter 720 illustrated in FIG. 7, or alternatively, may be inferred with reference to the descriptions related to the buffer 810 and the level shifter 820 illustrated in FIG. 8, and thus, will not be repeated.

Figure 10:
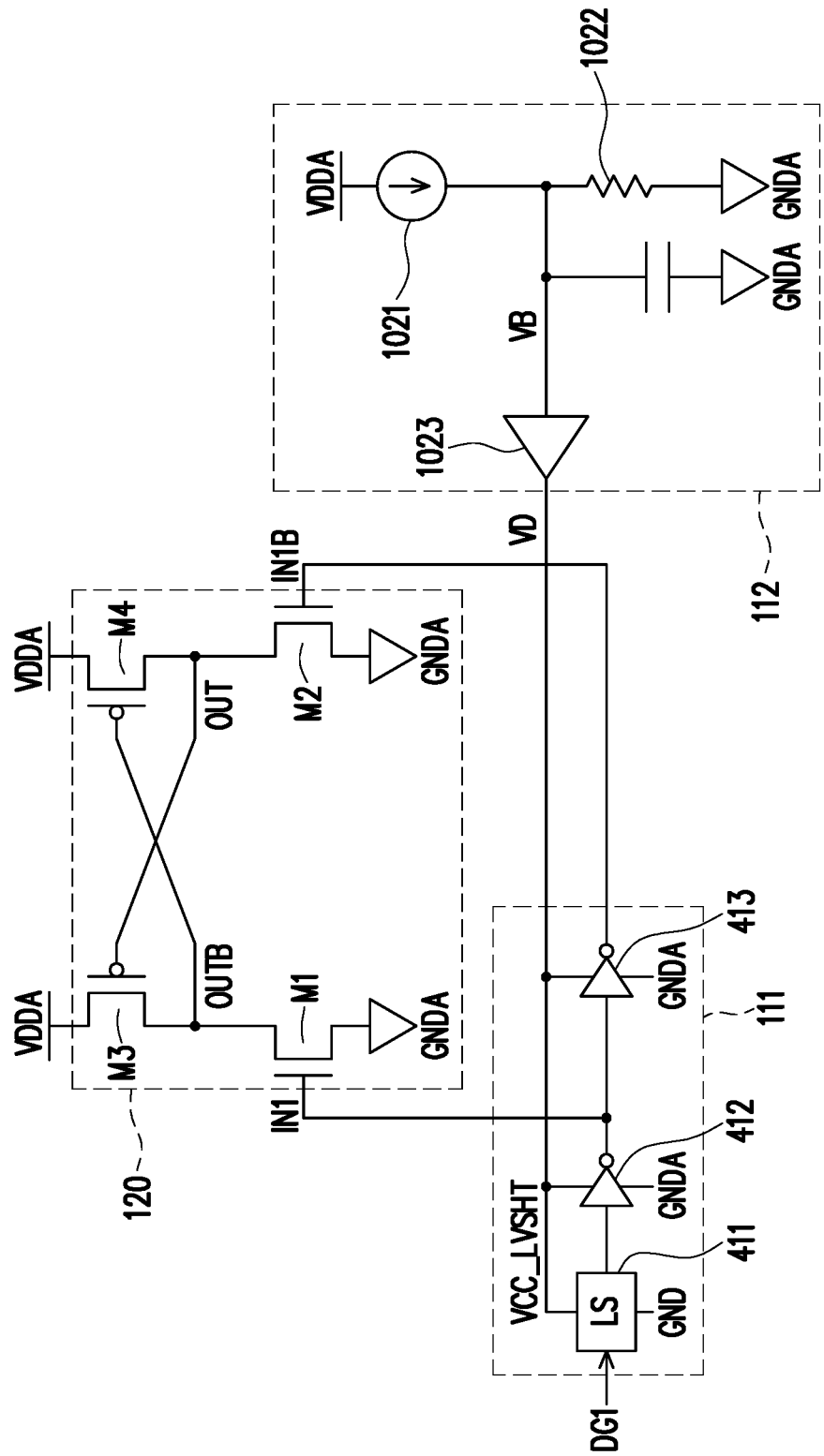
FIG. 10 is a schematic circuit diagram illustrating the level shifter device depicted in FIG. 1 according to yet another embodiment of the invention.

FIG. 10 is a schematic circuit diagram illustrating the level shifter device 100 depicted in FIG. 1 according to yet another embodiment of the invention. The embodiment illustrated in FIG. 10 is based on the dynamic voltage regulation circuit 112 providing the dynamic voltage VD to the power terminal of the buffer 111 as the power supply voltage VCC_LVSHT. The buffer 111 and the level shifter 120 illustrated in FIG. 10 may be inferred with reference to the descriptions related to the buffer 111 and the level shifter 120 illustrated in FIG. 4, and thus, will not be repeated.

In the embodiment illustrated in FIG. 10, the dynamic voltage regulation circuit 112 includes a current source 1021, a resistance element 1022 and an operational amplifier 1023. A first terminal of the resistance element 1022 is coupled to the current source 1021. A second terminal of the resistance element 1022 is coupled to the analog reference voltage GNDA. An input terminal of the operational amplifier 1023 is coupled to the first terminal of the resistance element 1022 to receive the bias voltage VB. An output terminal of the operational amplifier 1023 is coupled to the power terminal of the buffer 111 to provide the power supply voltage VCC_LVSHT (i.e., the dynamic voltage VD).

Figure 11:
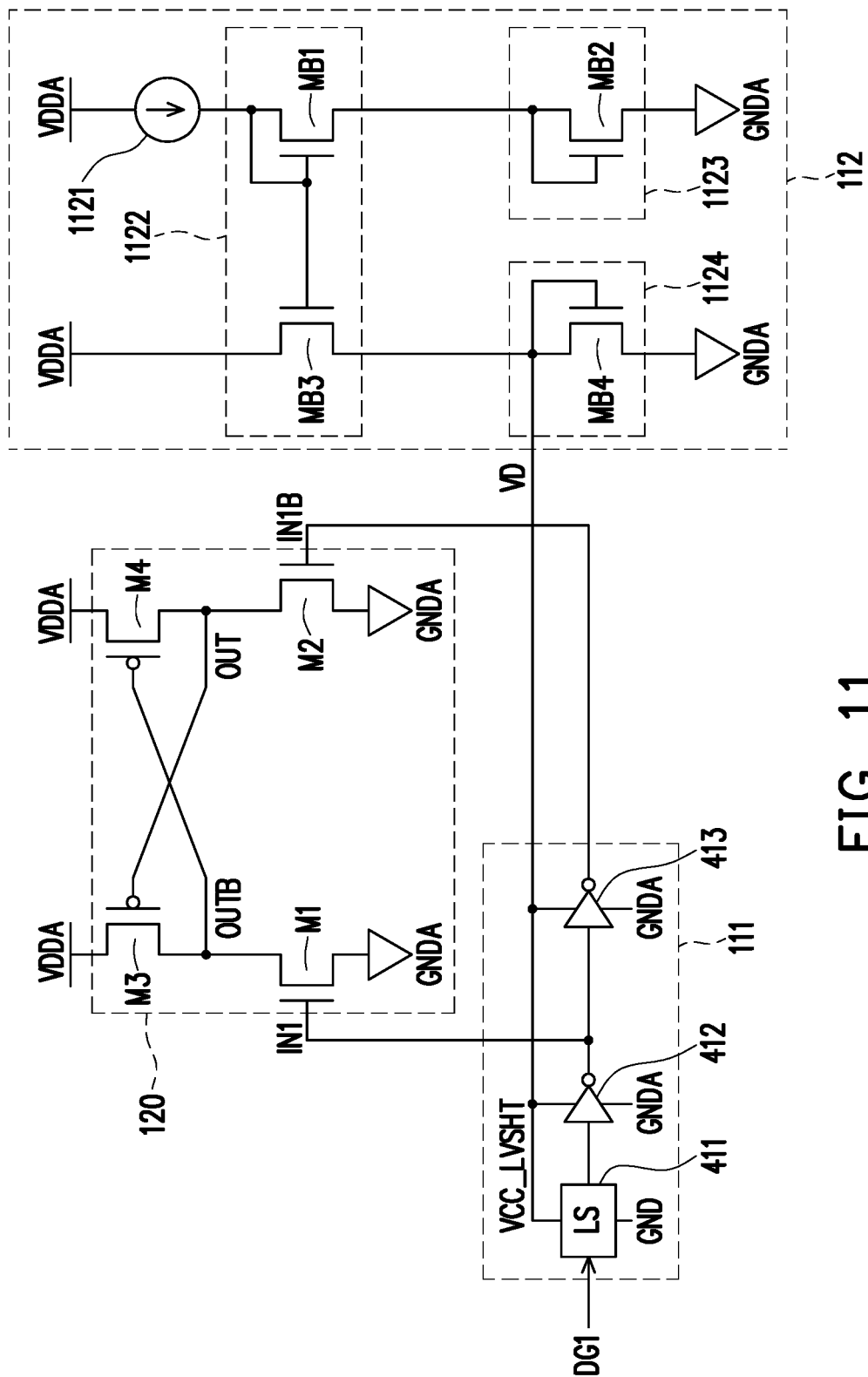
FIG. 11 is a schematic circuit diagram illustrating the level shifter device depicted in FIG. 1 according to still another embodiment of the invention.

FIG. 11 is a schematic circuit diagram illustrating the level shifter device 100 depicted in FIG. 1 according to still another embodiment of the invention. The embodiment illustrated in FIG. 11 is based on the dynamic voltage regulation circuit 112 providing the dynamic voltage VD to the power terminal of the buffer 111 as the power supply voltage VCC_LVSHT. The buffer 111 and the level shifter 120 illustrated in FIG. 11 may be inferred with reference to the descriptions related to the buffer 111 and the level shifter 120 illustrated in FIG. 4, and thus, will not be repeated.

In the embodiment illustrated in FIG. 11, the dynamic voltage regulation circuit 112 includes a current source 1121, a current mirror circuit 1122, a resistance element 1123 and a resistance element 1124. A first terminal of the resistance element 1122 is coupled to the current source 1121. The current mirror circuit 1122 includes the transistor MB1 and the transistor MB3. The first terminal (e.g., the drain) of the transistor MB1 is served as the first terminal of the current mirror circuit 1122. The control terminal (e.g., the gate) of the transistor MB2 is coupled to the first terminal of the transistor MB1. The second terminal (e.g., the source) of the transistor MB1 is served as a second terminal of the current mirror circuit 1122. The first terminal (e.g., the drain) of the transistor MB3 is coupled to the analog power supply voltage VDDA. The control terminal (e.g., the gate) of the transistor MB3 is coupled to the control terminal of the transistor MB1. The second terminal (e.g., the source) of the transistor MB3 is served as a third terminal of the current mirror circuit 1122.

A first terminal of the resistance element 1123 is coupled to the second terminal of the current mirror circuit 1122. A second terminal of the resistance element 1123 is coupled to the analog reference voltage GNDA. In the embodiment illustrated in FIG. 11, the resistance element 1123 includes the transistor MB2. The first terminal (e.g., the drain) of the transistor MB2 is served as the first terminal of the resistance element 1123. The control terminal (e.g., the gate) of the transistor MB2 is coupled to the first terminal of the transistor MB2. The second terminal (e.g., the source) of the transistor MB2 is served as the second terminal of the resistance element 1123.

A first terminal of the resistance element 1124 is coupled to the third terminal of the current mirror circuit 1122. The first terminal of the resistance element 1124 is further coupled to the power terminal of the buffer 111 to provide the power supply voltage VCC_LVSHT (i.e., the dynamic voltage VD). A second terminal of the resistance element 1124 is coupled to the analog reference voltage GNDA. In the embodiment illustrated in FIG. 11, the resistance element 1124 includes the transistor MB4. The first terminal (e.g., the drain) of the transistor MB4 is served as the first terminal of the resistance element 1124. The control terminal (e.g., the gate) of the transistor MB4 is coupled to the first terminal of the transistor MB4. The second terminal (e.g., the source) of the transistor MB4 is served as the second terminal of the resistance element 1124.

It is noted that the level shifter devices of the embodiments can be applied to source drivers for driving source lines of a display panel. More specifically, a source driver may include a receiving circuit, one or more digital circuits, one or more level shifter devices, and one or more analog circuits. The digital circuit may include one or more shifter registers, one or more input registers and one or more data latches. The level shifter can be arranged to be coupled between a first voltage (e.g., the power supply voltage VCC as shown in FIG. 3) and a first ground voltage (e.g., GND). The level shifter device, which may be coupled between a second voltage (e.g., the power supply voltage VCC_LVSHT as shown in FIG. 3) and a second ground voltage (e.g., GNDA) is configured to convert an output signal from the digital circuit from a first voltage level of the first voltage to a second voltage of the second voltage. As described in the above embodiments, the level shifter device can avoid operating abnormally due to an excessively small voltage across the level shifter device when the second voltage has greater ground bouncing.

Based on the above, the level shifter device and the operation method thereof provided by the embodiments of the invention can generate the dynamic voltage, wherein the level of the dynamic voltage is capable of reflecting the bounce of the analog reference voltage. The dynamic voltage can be provided to the level shifter and/or the buffer to mitigate the influence caused to the level shifter by the bounce of the analog reference voltage.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A level shifter device, comprising:
    a buffer, comprising an output terminal;
    a first level shifter, having a first input terminal coupled to the output terminal of the buffer and having a reference voltage terminal coupled to an analog reference voltage; and
    a dynamic voltage regulation circuit, configured to generate a dynamic voltage having a level varied according to a bounce of the analog reference voltage and provide the dynamic voltage to at least one of the buffer as a power supply and the first level shifter as a bias voltage.

2. The level shifter device according to claim 1, wherein the buffer comprises:
    a plurality of cascaded inverters, comprising a plurality of output terminals, wherein one of the output terminals is coupled to the first input terminal of the first level shifter.

3. The level shifter device according to claim 2, wherein the cascaded inverters comprise at least one power terminal coupled to the dynamic voltage regulation circuit to receive the dynamic voltage.

4. The level shifter device according to claim 3, wherein the buffer further comprises:
    a second level shifter, having a first output terminal coupled to the first input terminal of the first level shifter and having a power terminal coupled to the dynamic voltage regulation circuit.

5. The level shifter device according to claim 2, wherein the cascaded inverters comprise at least one power terminal coupled to a fixed power supply voltage.

6. The level shifter device according to claim 1, wherein the dynamic voltage regulation circuit is configured to generate the dynamic voltage according to the analog reference voltage.

7. The level shifter device according to claim 6, wherein the dynamic voltage regulation circuit comprises:
   a current source; and
   a resistance element, having a first terminal coupled to the current source and having a second terminal coupled to the analog reference voltage.

8. The level shifter device according to claim 7, wherein the dynamic voltage regulation circuit further comprises:
   an operational amplifier, having an input terminal coupled to the first terminal of the resistance element and having an output terminal of the operational amplifier coupled to a power terminal of the buffer to provide the dynamic voltage.

9. The level shifter device according to claim 6, wherein the dynamic voltage regulation circuit comprises:
   a current source;
   a current mirror circuit, having a first terminal coupled to the current source, a second terminal and a third terminal;
   a first resistance element, having a first terminal coupled to the second terminal of the current mirror circuit and having a second terminal coupled to the analog reference voltage; and
   a second resistance element, having a first terminal coupled to the third terminal of the current mirror circuit and coupled to a power terminal of the buffer and having a second terminal coupled to the analog reference voltage.

10. The level shifter device according to claim 1, wherein the dynamic voltage regulation circuit is configured to receive a reference voltage from a timing controller and generate the dynamic voltage according to the reference voltage.

11. The level shifter device according to claim 1, wherein the first level shifter comprises:
    a differential input pair, comprising a first transistor and a second transistor, wherein a control terminal of the first transistor is served as the first input terminal of the first level shifter.

12. A level shifter device, comprising:
    a level shifter, having at least one coupling terminal and having at least one input terminal; and
    a dynamic voltage detection circuit, configured to generate a dynamic voltage having a level capable of reflecting a bounce of an analog reference voltage and provide the dynamic voltage to the at least one coupling terminal of the level shifter to increase a resistance of the level shifter to the bounce of the analog reference voltage.

13. The level shifter device according to claim 12, wherein the level shifter comprises:
    a differential input pair, comprising a first transistor and a second transistor, wherein a first terminal of the first transistor is served as a first input terminal of the level shifter, a first terminal of the second transistor is served as a second input terminal of the level shifter, and a control terminal of the first transistor and a control terminal of the second transistor are coupled to the dynamic voltage detection circuit to receive the dynamic voltage.

14. The level shifter device according to claim 12, wherein the dynamic voltage detection circuit comprises:
    a buffer, having a power terminal and an output terminal respectively coupled to the dynamic voltage and the input terminal of the level shifter.

15. The level shifter device according to claim 14, wherein the dynamic voltage detection circuit comprises:
    a dynamic voltage regulation circuit, configured to generate the dynamic voltage having a level varied according to the bounce of the analog reference voltage and provide the dynamic voltage to at least one of a buffer as a power supply and the level shifter as a bias voltage.

16. An operating method of a level shifter device, comprising:
    providing a buffer and a first level shifter, wherein a first input terminal of the first level shifter is coupled to an output terminal of the buffer, and a reference voltage terminal of the first level shifter is coupled to an analog reference voltage;
    generating, by a dynamic voltage regulation circuit, a dynamic voltage having a level varied according to a bounce of the analog reference voltage; and
    providing, by the dynamic voltage regulation circuit, the dynamic voltage to at least one of the buffer as a power supply and the first level shifter as a bias voltage.

* * * * *